United States Patent [19]
Poirier

[11] 3,715,637
[45] Feb. 6, 1973

[54] LOGIC CIRCUITS EMPLOYING COMPLEMENTARY FIELD-EFFECT TRANSISTORS IN WHICH THE GATE IS INSULATED FROM THE SUBSTRATE

[75] Inventor: Raymond Poirier, 75 Paris 101, France

[73] Assignee: Societe Europeenne de Semiconducteurs et de Miroelectronique

[22] Filed: Dec. 30, 1971

[21] Appl. No.: 214,002

[30] Foreign Application Priority Data

Jan. 12, 1971 France....................................7100772

[52] U.S. Cl..........317/235 R, 317/235 B, 317/235 G, 317/235 N, 307/205, 307/304, 307/311

[51] Int. Cl.................................................H01l 19/00

[58] Field of Search.......317/235 G, 235 B; 307/311, 307/304, 205

[56] References Cited

UNITED STATES PATENTS 3,409,839 11/1968 Crowe....................................317/235

*Primary Examiner*—Jerry D. Craig
*Attorney*—Cushman, Darby & Cushman

[57] ABSTRACT

An inverter employing complementary MOS transistors, insensitive to light radiation, comprises in each transistor, a diffused zone of opposite conductivity type to that of the substrate this diffused zone being connected by a conduction channel to the corresponding drain, when the transistor is driven conductive.

3 Claims, 7 Drawing Figures

LOGIC CIRCUITS EMPLOYING COMPLEMENTARY FIELD-EFFECT TRANSISTORS IN WHICH THE GATE IS INSULATED FROM THE SUBSTRATE

Logic circuits which employ field-effect transistors in which the gate is insulated from the substrate, said transistors of the MOS (metal oxide semiconductor) type, are well known.

The basic elements of these logic circuits are inverters.

The inverters are elements with an input and output, each of which can carry two voltage levels, the high level voltage or 1 level, and the low level voltage or 0 level.

When the input is at 0 level, the output should be at the 1 level, and vice versa. Inverters of this kind can comprise two complementary MOS transistors, one an N-type substrate and the other a P-type substrate, of which, under the influence of the input voltage, alternately one is conductive and the other blocked.

However, it is known in the art that when a MOS transistor is exposed to intense light radiation, the junctions formed with its source or drain and the substrate behave as current generators.

The logic circuit then ceases to operate correctly. Thus, the problem arises of rendering the logic circuit insensitive to radiation of this kind. This problem is complicated by the fact that it is virtually impossible to obtain complementary MOS structures which have identical gate voltage versus source-drain current characteristics.

The present invention relates to a logic circuit of the complementary MOS type, which does not exhibit these drawbacks.

The logic circuit using complementary MOS transistors, in accordance with the invention, comprises two such MOS transistors, one on an N-type substrate and the other on a P-type substrate, the input of the element being connected to the gates of said MOS transistors, the output to their drains and one of the MOS transistors having its source and its substrate connected to a fixed potential d.c. source, whilst the other has its source and substrate grounded. Photoconductor means are provided in order, under the action of radiation, to multiply by a factor substantially in excess of 1 the current flowing through each MOS transistor when it is conductive.

The invention will be better understood from a consideration of the ensuing description and by reference to the attached drawings in which.

Figure 1:
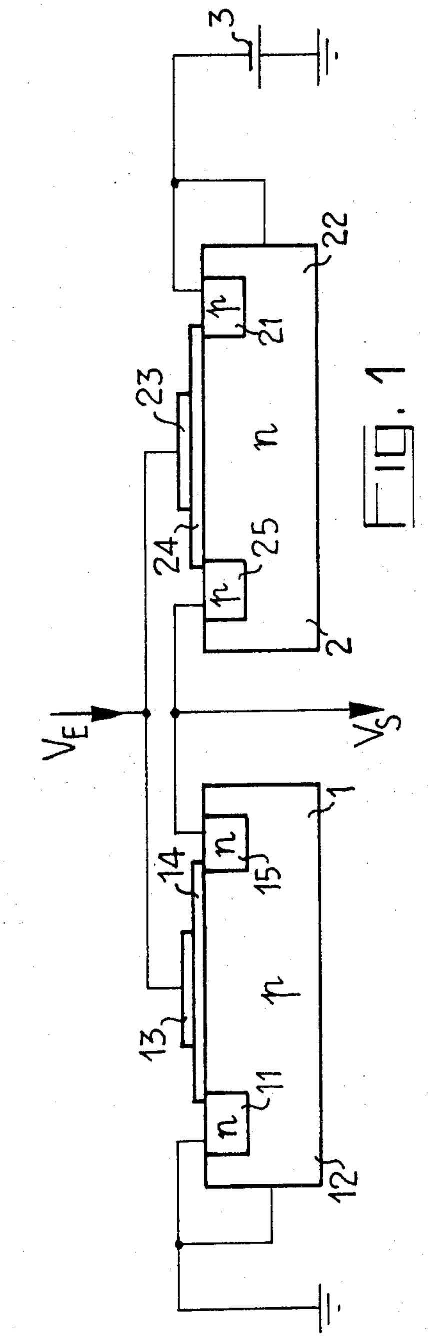
FIG. 1 illustrates the diagram of an inverter of known type, using complementary MOS systems.

In FIG. 1, two MOS field-effect transistors one of which 1 has an N-type substrate and the other of which 2 has a P-type substrate, can be seen.

As known, these transistors comprise a source and a gate which are isolated from the substrate.

On the MOS 1, the source 11, which is an N-type diffused area, is grounded and connected to the substrate 12. A gate 13 is a metal layer insulated from the substrate by insulating layer 14. It is connected, as well as the gate 23 of the element 2, which is identical to it, to the input of the inverter.

The drains 15 and 25, taking the form in the case of the transistor 1 of an N-type diffused area and in the case of the transistor 2 of a P-type diffused area, are interconnected and produce the output voltage $V_S$, the source 21 of the transistor 2, which is identical to the drain 25, being connected along with the substrate 22 to the positive pole of a supply source 3 producing a positive fixed voltage V.

The operation will be understood from the ensuing figures.

Figure 2:
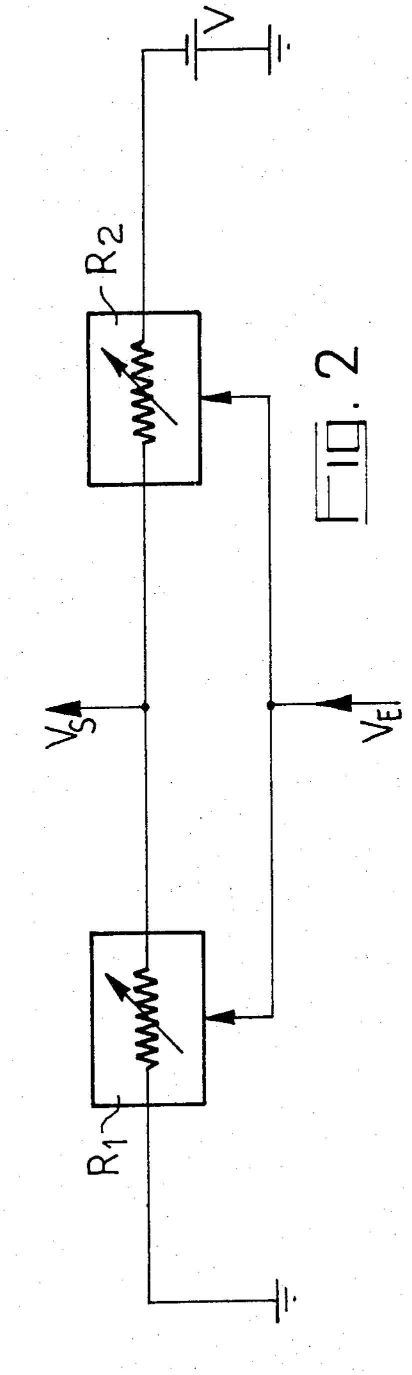
FIG. 2 illustrates its equivalent circuit diagram.
Figure 4:
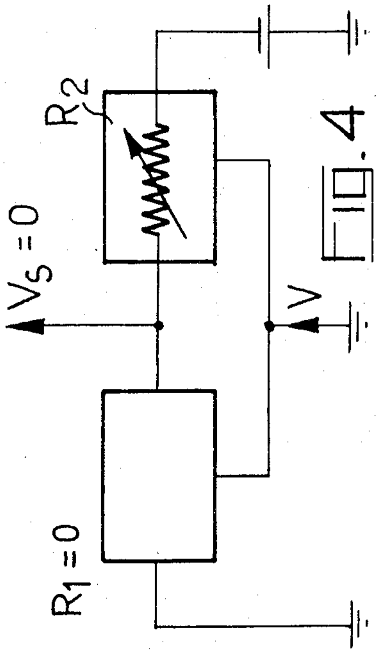
FIGS. 3 and 4 are explanatory figures.

FIG. 2 is the equivalent circuit diagram. Each MOS transistor is equivalent to a variable resistor $R_1$ or $R_2$, its resistance being a function of the gate voltage $V_E$. In the case of the transistor 1 the control voltage is $V_E - V_{S1} = V_E$ ($V_{S1}$ the source potential being that of ground).

In the case of the transistor 2, the control voltage is $V - V_E$ (V is the source voltage of the MOS transistor 2). To the input there will be applied either the voltage $V_E$ in excess of the blocking voltage of the two transistors, which we will assume to be equal to or less than V, or a zero voltage.

In the first case, input voltage $V_E = 0$, the transistor 1 will have a gate-source voltage difference of zero and will be blocked, i.e., not conductive, assuming that it is of the enhancement type. The transistor 2, which we will likewise assume to be of the enhancement type, will be conductive under these same conditions. Assuming that its resistance is low, the output voltage will be equal to V (FIG. 3).

Figure 3:
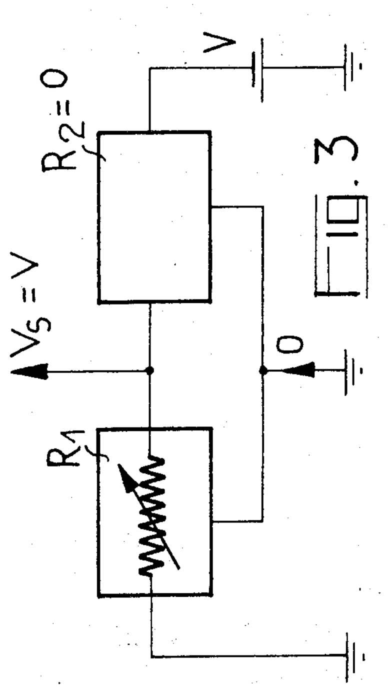

In the second case, $V_E = V$, of FIG. 3, the transistor 1 will be conductive and the transistor 2 blocked. The output voltage will be zero.

If, now, the assembly is exposed to radiation, each of the PN junctions will behave as a photodiode, in other words will generate a current. We will disregard the sources. These are short-circuited to their respective substrates and the effect of the currents which they generate can be neglected.

Figure 5:
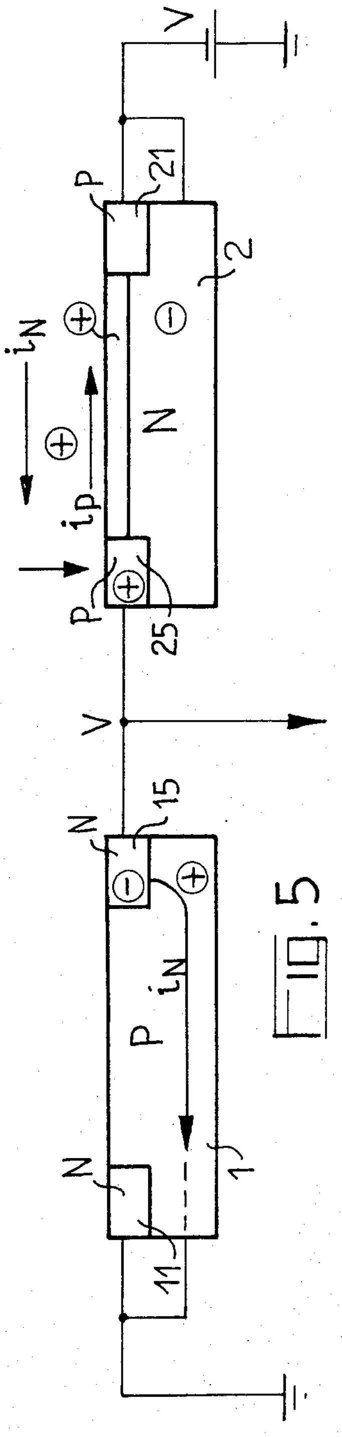
FIG. 5 illustrates the photo-currents generated in the device of FIG. 1.

FIG. 5 considers the case where the MOS transistor 2 is conductive, the transistor 1 being blocked. In this case, the source 21 and the drain 25 are at the same potential V. A conductive P-type channel is established between the source and the drain under the effect of the zero voltage applied to the gate of this transistor.

Each photon, impinging upon the drain 25, generate an electron hole pair (+ charge and − charge).

The + charges will tend to increase the charge density in the drain. This increase will give rise to a current $i_p$ which flows through the channel from the source to the drain.

Since the transistor 1 is blocked, this current will flow back to the substrate of the transistor 2.

As far as the transistor 1 is concerned, the increase in the concentration of − charge in the drain will result in a current $i_N$ of minority charge carriers, of the drain 15 to earth.

The circuit carrying this current $i_N$ is returned via the voltage source V through the P-type channel of the transistor 2.

The result is that the channel will carry two currents flowing in opposite directions. If R is its resistance, it will be the location of a voltage drop $\Delta V = R\ (i_P - i_N)$.

The output voltage will be reduced and will be equivalent to $V - \Delta V$.

If $\Delta V$ is sufficiently high, that is to say $i_P$ is sufficiently large, the inverter will no longer operate correctly and in the circuits which it controls, it can produce unwanted triggering.

In order to overcome this drawback, the invention provides means for increasing $i_N$ and making sure that the difference $i_P - i_N$ is negative.

Figure 6:
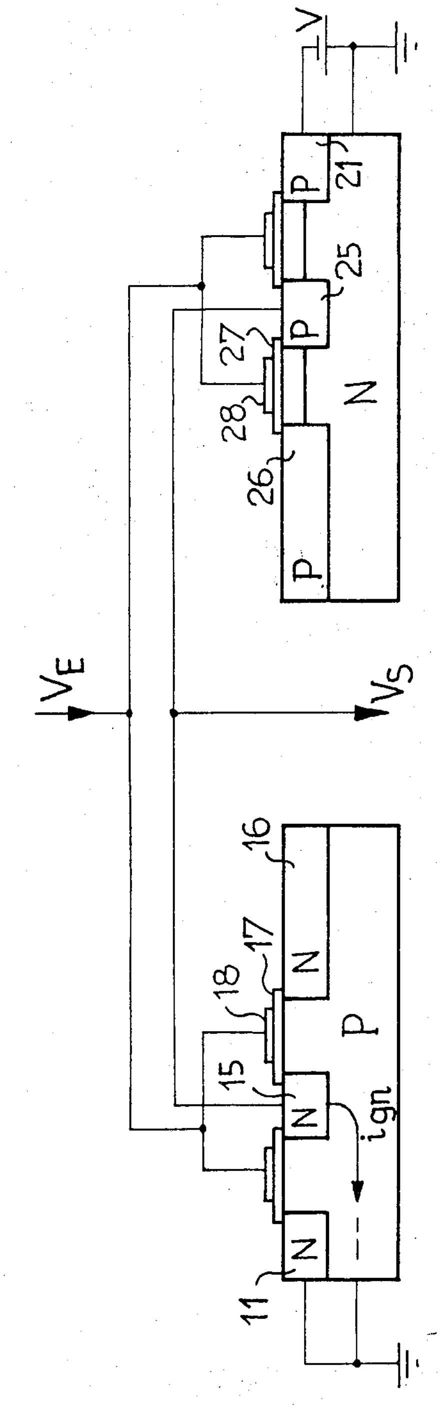
FIG. 6 illustrates the device in accordance with the invention in transverse section and FIG. 7 a much enlarged view of one of the two transistors.

The device in accordance with the invention is shown in FIG. 6.

The transistors 1 and 2 have two supplementary diffused areas 16 and 26 respectively, N-type in the case of the transistor 1 and P-type in the case of the transistor 2. These diffused areas have an actual area which is in the order of 4 to 5 times larger than those of the sources and drains. The regions located between the two diffused areas 15 and 16, 25 and 26, are covered with oxide layers 17 and 27, carrying metal gates 18 and 28 connected in parallel with the foregoing. The result is that in the case of the conductive transistor, for example the transistor 2, there appears under the action of the voltage applied to the gate a channel P connecting the diffused area 26 and the drain 25, carrying a current Igp.

Figure 7:
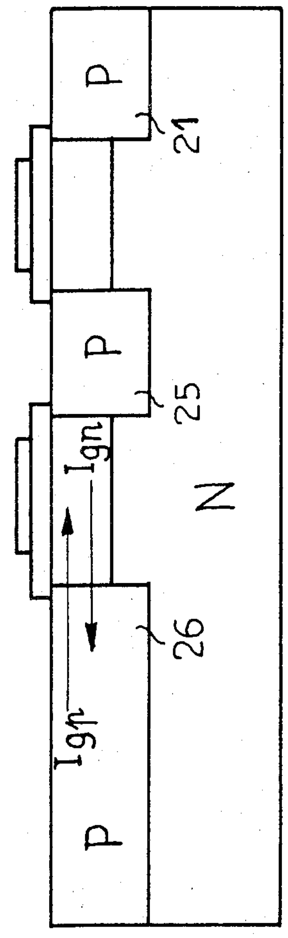

FIG. 7 illustrates the transistor 2 and its enlarged conduction channels. The result of the presence of the diffused area 26 and its connection, through the conduction channel, with the drain 26, is a large increase in the current $i_P$, with respect to the current $i_N$, and as a consequence $i_N - i_P$ is negative.

As far as the diffused area 16 is concerned, since the transistor 1 is blocked, no conduction channel connects it with the drain 15. The result is that the photocurrent which it produces has no influence upon the potential of the latter and consequently upon the output voltage.

Thus, an inverter is created which is insensitive to high-intensity radiation of the kind produced for example by an atomic bomb.

What I claim is:

1. A logic element comprising in combination: an input and an output, a first and a second field effect transistor of the MOS enhancement type, having respective sources gates and drains, said first and second transistors having respective substrates of opposite types of conductivity; said gates being connected to said input: said source of said first transistor being connected to its substrate; said drain of said first transistor, and said drain of said second transistor being connected to said output, and the source of said second transistor having connection means to a d.c. source; said transistors having respective diffusion zones, and respective further gates positioned for forming further channels between said respective zones and said respective sources, said zones having respective types of conductivity opposite to that of the corresponding substrate; said further gates being connected to said input.

2. A logic circuit as claimed in claim 1, wherein said regions have respective surfaces substantially larger than that of said sources.

3. A logic circuit as claimed in claim 2 wherein said surfaces are at least three times larger than that of said sources.

* * * * *